United States Patent
Sudo

(10) Patent No.: US 9,178,064 B2
(45) Date of Patent: Nov. 3, 2015

(54) METHOD FOR MANUFACTURING FIN SEMICONDUCTOR DEVICE USING DUAL MASKING LAYERS

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 397 days.

(21) Appl. No.: 13/596,422

(22) Filed: Aug. 28, 2012

(65) Prior Publication Data

US 2013/0230953 A1 Sep. 5, 2013

(30) Foreign Application Priority Data

Mar. 2, 2012 (JP) ................................. 2012-046810

(51) Int. Cl.
*H01L 21/336* (2006.01)
*H01L 29/78* (2006.01)
*H01L 29/66* (2006.01)

(52) U.S. Cl.
CPC ........ *H01L 29/785* (2013.01); *H01L 29/66795* (2013.01); *H01L 29/66803* (2013.01); *H01L 29/66818* (2013.01)

(58) Field of Classification Search
CPC ............ H01L 29/785; H01L 29/66795; H01L 29/66803; H01L 29/66818
USPC ........................................................ 438/268
See application file for complete search history.

(56) References Cited

U.S. PATENT DOCUMENTS

| | | | |
|---|---|---|---|
| 6,998,676 B2 | 2/2006 | Kondo et al. | |
| 7,153,733 B2 * | 12/2006 | Seo et al. | 438/197 |
| 2005/0208715 A1 * | 9/2005 | Seo et al. | 438/197 |
| 2007/0004117 A1 | 1/2007 | Yagishita | |
| 2007/0221991 A1 | 9/2007 | Chung et al. | |
| 2008/0160738 A1 | 7/2008 | Cho | |
| 2010/0072541 A1 | 3/2010 | Chung et al. | |
| 2010/0081240 A1 | 4/2010 | Yagishita | |
| 2011/0049599 A1 | 3/2011 | Taketani | |
| 2011/0068401 A1 * | 3/2011 | Izumida et al. | 257/347 |
| 2011/0165738 A1 | 7/2011 | Tezuka et al. | |
| 2015/0044829 A1 * | 2/2015 | Kim et al. | 438/199 |

* cited by examiner

*Primary Examiner* — Mohammad Islam
*Assistant Examiner* — John P Dulka
(74) *Attorney, Agent, or Firm* — Finnegan, Henderson, Farabow, Garrett & Dunner, L.L.P.

(57) ABSTRACT

According to one embodiment, a method for manufacturing a semiconductor device, includes preparing a structure body. In the structure body, a fin extending in a first direction is formed on an upper surface of a semiconductor substrate, a lower-side mask member is provided on the fin, and an upper-side mask member that is wider than the fin and the lower-side mask member is provided on the lower-side mask member. The method includes implanting an impurity into the semiconductor substrate with the upper-side mask member and the lower-side mask member as a mask, removing the upper-side mask member, forming a gate insulator film on a side surface of the fin, forming a conductive film that covers the fin and the lower-side mask member, forming a mask for gate having a pattern extending in a second direction, and removing selectively the conductive film to form a gate electrode.

20 Claims, 10 Drawing Sheets

METHOD FOR MANUFACTURING FIN SEMICONDUCTOR DEVICE USING DUAL MASKING LAYERS

CROSS-REFERENCE TO RELATED APPLICATIONS

This application is based upon and claims the benefit of priority from the prior Japanese Patent Application No. 2012-046810, filed on Mar. 2, 2012; the entire contents of which are incorporated herein by reference.

FIELD

Embodiments described herein relate generally to a method for manufacturing a semiconductor device.

BACKGROUND

Recently, a Fin type MOSFET (hereinafter referred to as a "FinFET") has been proposed in order to establish a balance between improvement of integration of a MOSFET (Metal Oxide Semiconductor Field Effect Transistor) and an increase in on-current. In the FinFET, projected fins each of which extends in one direction are formed on an upper surface of a semiconductor substrate, and gate electrodes each of which extends in another direction are formed so as to straddle the fins. Therefore, in the fin, an outer periphery surrounded by the gate electrodes constitutes a channel region, and a channel width can be increased without enlarging an element area.

DETAILED DESCRIPTION

In general, according to one embodiment, a method for manufacturing a semiconductor device, includes preparing a structure body. In the structure body, a fin extending in a first direction is formed on an upper surface of a semiconductor substrate, a lower-side mask member is provided in a region immediately above the fin, and an upper-side mask member that is wider than the fin and the lower-side mask member is provided in a region including a region immediately above the lower-side mask member. The method includes implanting an impurity into the semiconductor substrate with the upper-side mask member and the lower-side mask member as a mask. The method includes removing the upper-side mask member. The method includes forming a gate insulator film on a side surface of the fin. The method includes forming a conductive film that covers the fin and the lower-side mask member. The method includes forming a mask for gate on the conductive film. In the mask for gate, a pattern extends in a second direction intersecting the first direction. And, the method includes removing selectively the conductive film to form a gate electrode by performing etching with the mask for gate and the lower-side mask member as a mask. The gate electrode extends in the second direction to straddle the fin.

Hereinafter, an embodiment of the invention will be described with reference to the drawings. FIGS. 1A to 8B are process sectional views illustrating a semiconductor device producing method according to an embodiment. FIG. 9 is a perspective view illustrating a semiconductor device of the embodiment.

For example, the semiconductor device of the embodiment is a memory device, such as an MRAM (Magnetoresistive Random Access Memory). Plural memory cells are two-dimensionally arrayed in the MRAM, and a magnetoresistive memory element and a transistor are provided in each memory cell. In the embodiment, the transistor constituting each memory cell is a FinFET described later.

Figure 1A:
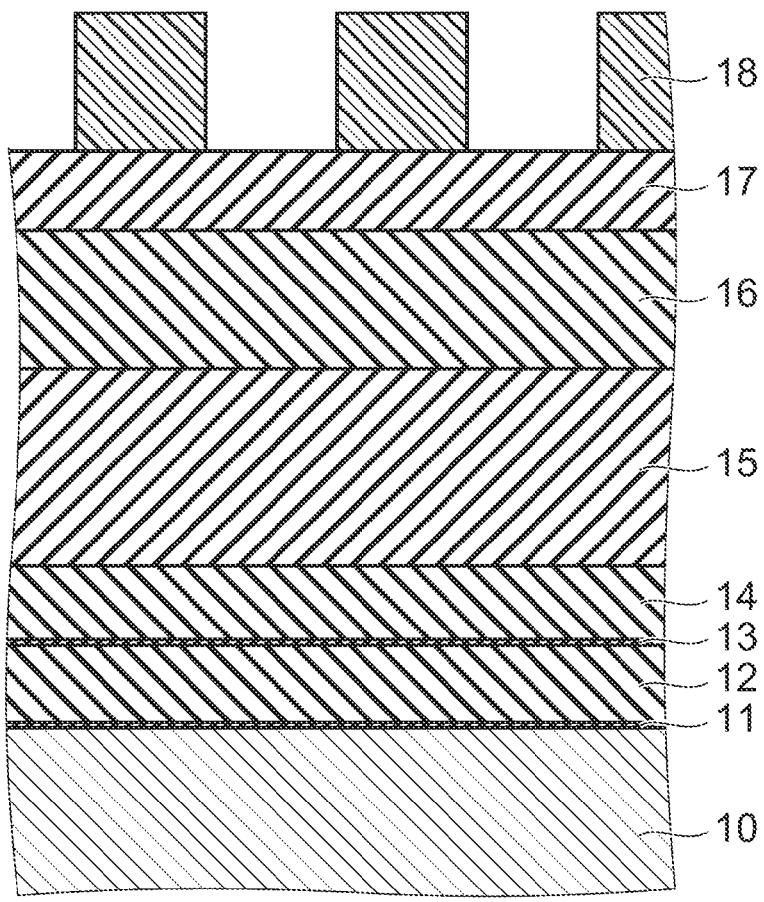
FIGS. 1A to 8B are process sectional views illustrating a method for manufacturing a semiconductor device according to an embodiment.

As illustrated in FIG. 1A, a silicon substrate 10 is prepared. For example, the silicon substrate 10 is made of single-crystal silicon into which an impurity is introduced, and the silicon substrate 10 is a part of a silicon wafer. A silicon oxide film 11 is formed on an upper surface of the silicon substrate 10.

Then, a silicon nitride film 12 is formed as a lower-side mask film. For example, using hexachlorodisilane (HCD) as a source gas, the silicon nitride film 12 is deposited by an LP-CVD (Low-Pressure Chemical Vapor Deposition) method at temperatures of 550° C. or less.

A silicon oxide film 13 is formed as a barrier film by oxidizing the upper surface of the silicon nitride film 12. Although the silicon oxide film 13 may be deposited by a deposition method, preferably the silicon oxide film 13 is deposited by a plasma oxidation method because the plasma oxidation method is suitable for formation of a thinner film at a lower etching rate.

A silicon nitride film 14 is formed as an upper-side mask film. For example, using dichlorosilane (DCS) as the source gas, the silicon nitride film 14 is deposited by the LP-CVD method at temperature of 700° C. or more.

Thus, the silicon nitride film 12 and the silicon nitride film 14 are formed as the film containing silicon nitride by the different deposition methods. Usually, as described later, an etching rate of the lower-side silicon nitride film 12 that is deposited at a relatively low temperature using HCD is higher than an etching rate of the upper-side silicon nitride film 14 that is deposited at a relatively high temperature using DCS when wet etching is performed.

Then, a hard mask material 15 made of silicon oxide for example, a hard mask material 16 made of silicon nitride for example, and an antireflection film 17 are deposited in this order. A resist film is formed on the antireflection film 17 and patterned by a lithography method, thereby forming a resist mask 18. Plural stripe patterns each of which extends in one direction (hereinafter referred to as a "fin direction") are formed on the resist mask 18.

Therefore, a layered body, in which the silicon oxide film 11, the silicon nitride film 12, the silicon oxide film 13, the silicon nitride film 14, the hard mask material 15, the hard mask material 16, the antireflection film 17, and the resist mask 18 are stacked in this order from the lower layer side, is formed on the silicon substrate 10.

Figure 1B:
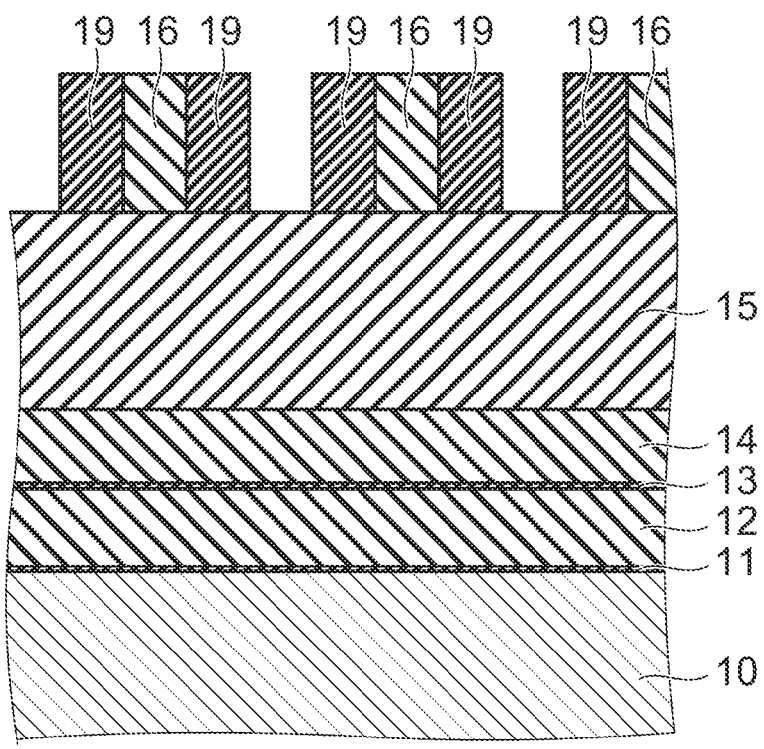

Then, as illustrated in FIG. 1B, RIE (Reactive Ion Etching) is performed with the resist mask 18 as a mask to selectively remove the antireflection film 17 and the hard mask material 16, and a pattern of the resist mask 18 is transferred to the hard mask material 16. Therefore, the stripe pattern extending in the fin direction is formed in the hard mask material 16. Then, a slimming treatment is performed to the patterned hard mask material 16 to decrease a width of each pattern. Then, for example, an amorphous silicon film is deposited on the whole surface, and the whole surface is etched back. Therefore, the amorphous silicon film remains only on a side surface of each pattern of the hard mask material 16 to form a sidewall 19. An average array period of the sidewalls 19 is half an array period of the patterns of the resist mask 18.

Figure 2A:
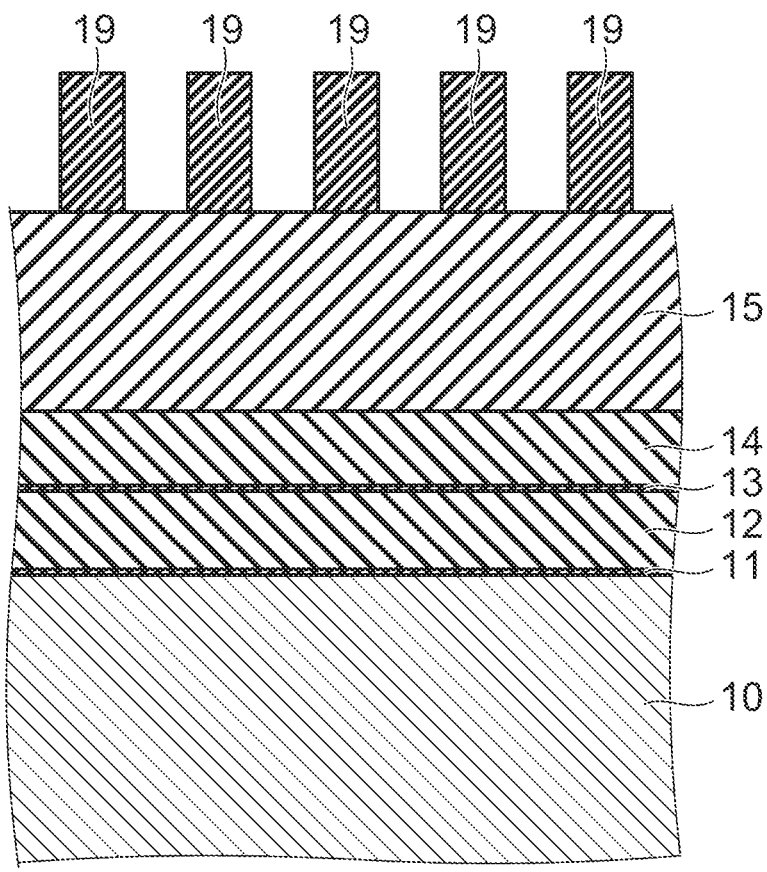
Figure 2B:
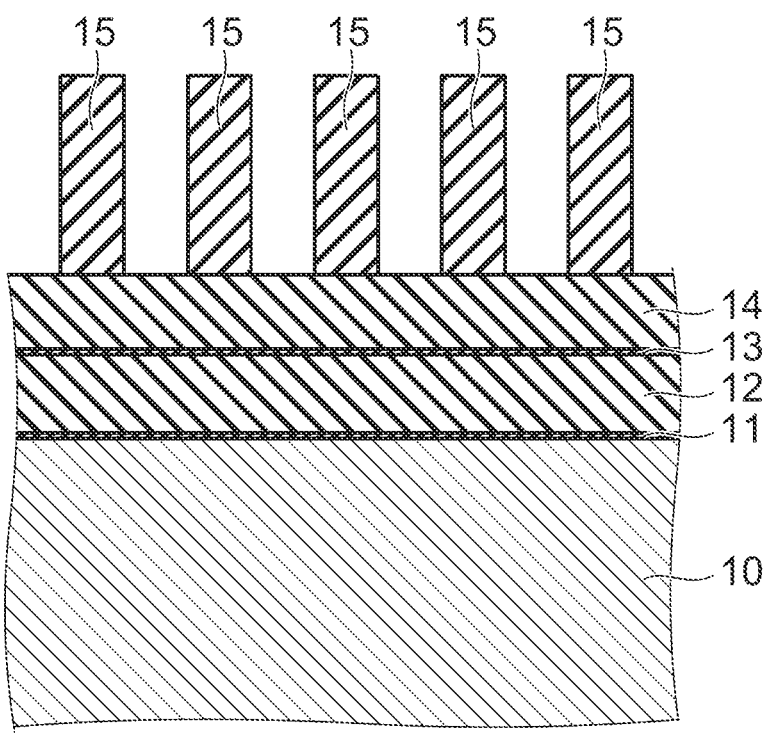

Then, as illustrated in FIG. 2A, the hard mask material 16 is removed by the wet etching. Then, as illustrated in FIG. 2B, the etching is performed with the sidewall 19 as a mask to transfer the pattern of the sidewall 19 to the hard mask material 15. Therefore, the stripe pattern extending in the fin direction is formed in the hard mask material 15, thereby constituting a mask for fin.

Figure 3A:
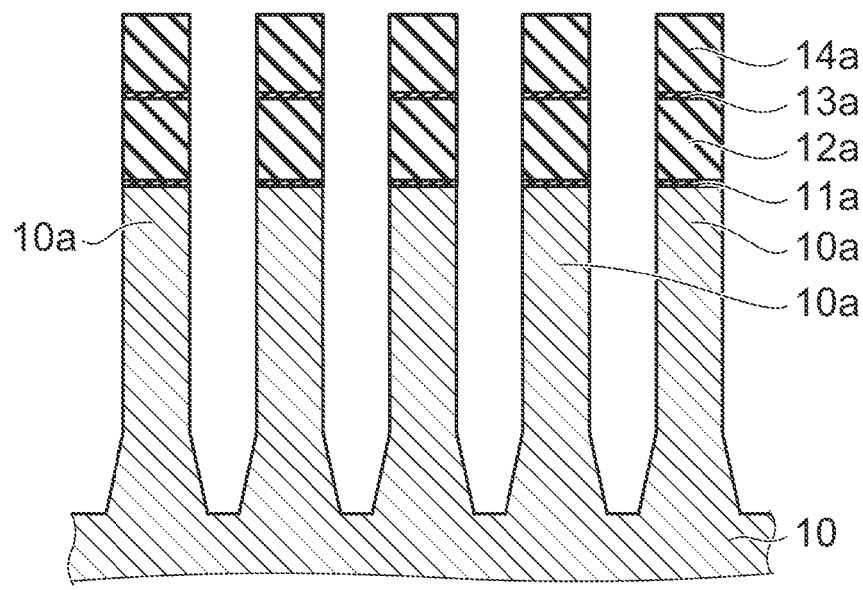

Then, as illustrated in FIG. 3A, by performing the etching with the hard mask material 15 as a mask, the silicon nitride film 14, the silicon oxide film 13, the silicon nitride film 12, and the silicon oxide film 11 are selectively removed, and an upper layer portion of the silicon substrate 10 is also selectively removed. Therefore, the silicon nitride film 14, the silicon oxide film 13, the silicon nitride film 12, the silicon oxide film 11, and the upper layer portion of the silicon substrate 10 are processed into the stripe shape. As a result, the silicon nitride film 14 constitutes a silicon nitride member 14a that is of the upper-side mask member, the silicon oxide film 13 constitutes a silicon oxide member 13a that is of the barrier member, the silicon nitride film 12 constitutes a silicon nitride member 12a that is of the lower-side mask member, the silicon oxide film 11 constitutes a silicon oxide member 11a, and the upper layer portion of the silicon substrate 10 constitutes a fin 10a.

Figure 3B:
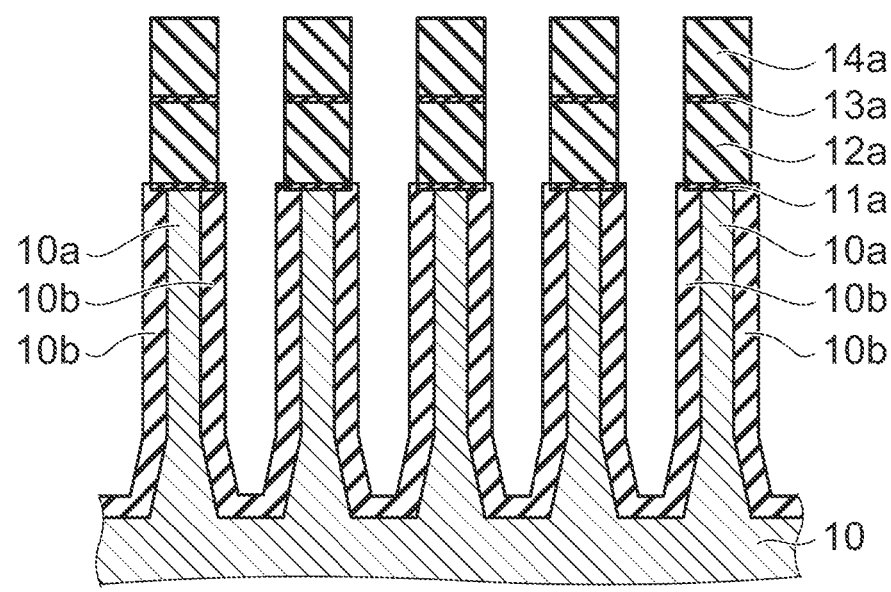

As illustrated in FIG. 3B, an oxidation treatment is performed to oxidize both side portions of the fin 10a, thereby forming a silicon oxide layer 10b. Preferably a thermal oxidation treatment is used as the oxidation treatment in order to suppress oxidation of the silicon nitride members 12a and 14a.

Figure 4A:
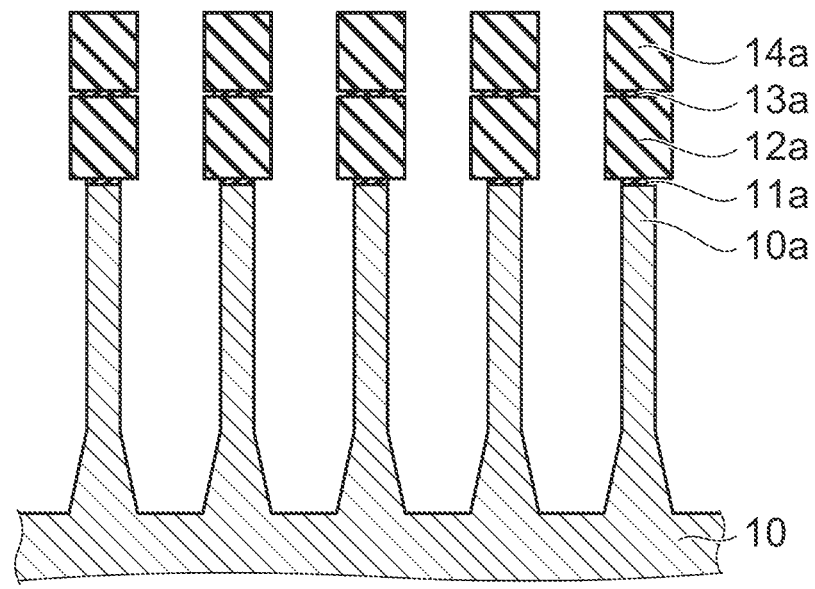

Then, as illustrated in FIG. 4A, the wet etching is performed to remove the silicon oxide layer 10b (see FIG. 3B). Therefore, the fin 10a becomes thinner than before the formation of the silicon oxide layer 10b. At this point, exposed portions of the silicon oxide members 11a and 13a are also etched, and recessed. The silicon nitride member 12a having the relatively high wet etching rate is slightly etched (not illustrated).

Figure 4B:
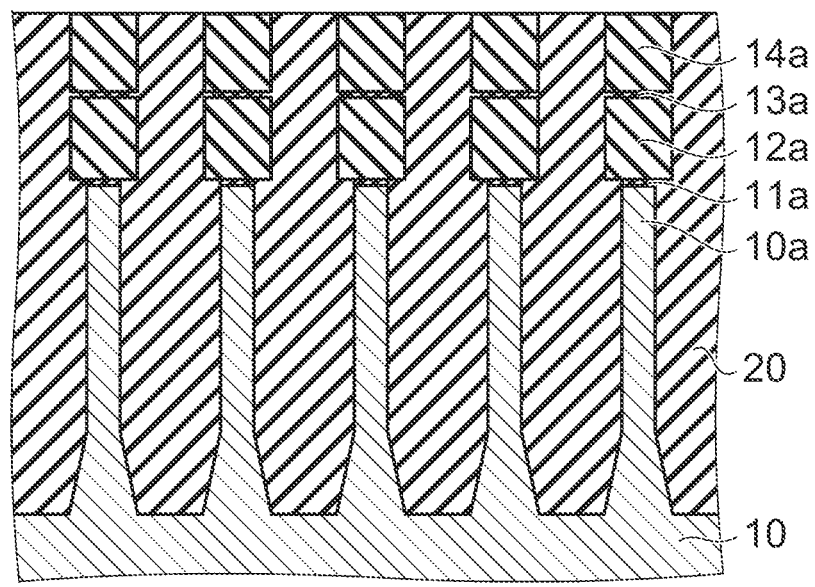

As illustrated in FIG. 4B, silicon oxide is deposited on the whole surface. Then, CMP (Chemical Mechanical Polishing) is performed with the silicon nitride member 14a as a stopper material to planarize the upper surface of the deposited silicon oxide. Therefore, an element isolation insulating film 20 is formed so as to cover the upper surface of the silicon substrate 10 and the stacked body including the fin 10a, the silicon oxide members 11a, the silicon nitride member 12a and the silicon oxide members 13a.

Figure 5A:
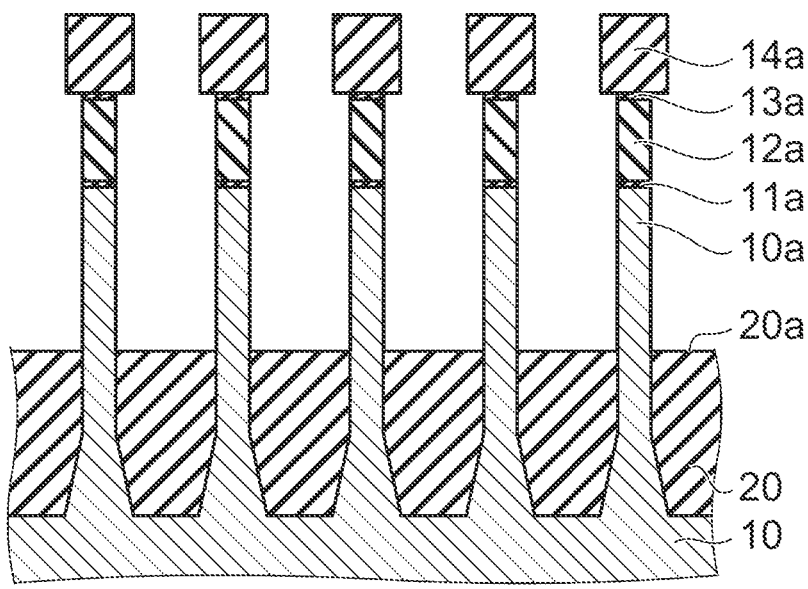

Then, as illustrated in FIG. 5A, the wet etching is performed to the element isolation insulating film 20. The wet etching is performed under a condition that an etching rate of the silicon nitride member 12a is higher than an etching rate of the silicon nitride member 14a. Therefore, an upper surface 20a of the element isolation insulating film 20 is etched back. The upper surface 20 is recessed to a level of a central portion in a vertical direction of the fin 10a. As a result, an upper portion of the fin 10a is exposed while a lower portion of the fin 10a is covered with the element isolation insulating film 20. At this point, the silicon nitride member 12a is selectively etched with respect to the silicon nitride member 14a, the lower-side silicon nitride member 12a becomes thinner than the upper-side silicon nitride member 14a, and becomes less than or equal to the width of an upper end portion of the fin 10a.

Through the above processes, the plural fins 10a each of which extends in the fin direction are formed on the upper surface of the silicon substrate 10, and structure bodies are prepared. In each of the structure bodies, the silicon nitride member 12a is provided in the region immediately above the fin 10a, and the silicon nitride member 14a, which is wider than the fin 10a and the silicon nitride member 12a, is provided in the region including a region immediately above the silicon nitride member 12a. Alternatively, the process in FIG. 4A is neglected, and the fin 10a may be slimmed by removing the upper portion of the silicon oxide layer 10b in the process in FIG. 5A of recessing the upper surface 20a of the element isolation insulating film 20.

Figure 5B:
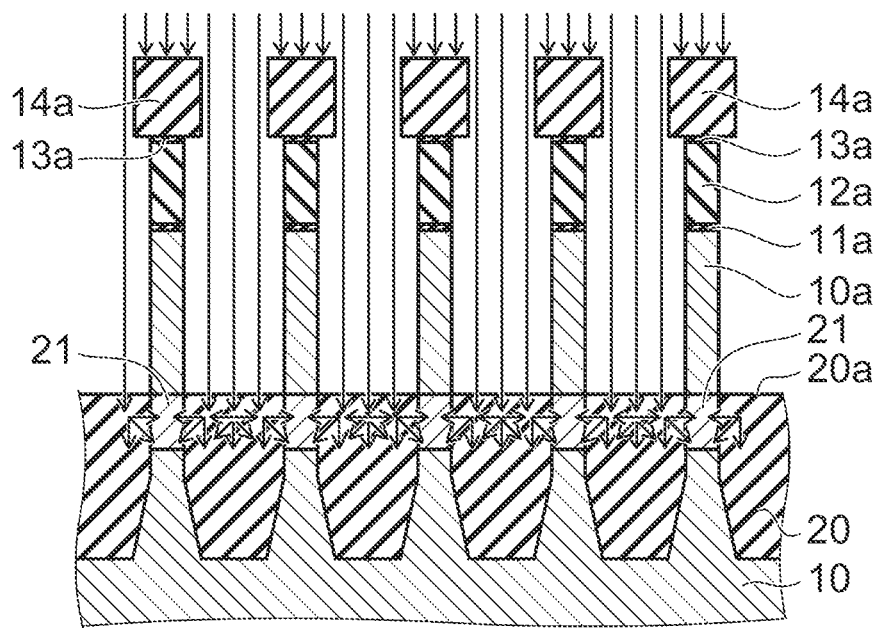

Then, as illustrated in FIG. 5B, ion implantation of an impurity, for example, boron is performed into the silicon substrate 10 from substantially immediately above with the silicon nitride members 14a and 12a as a mask. At this point, because the thick silicon nitride member in which the silicon nitride members 12a and 14a are stacked exists on the fin 10a, the boron is not implanted into the upper surface of the fin 10a. The silicon nitride member 14a is wider than the fin 10a, and the fin 10a and its neighborhood are covered with silicon nitride member 14a when viewed from above. The boron is not directly implanted into the side surface of the fin 10a even if a boron implanting direction is oblique relative to the vertical direction. The boron is temporarily implanted into the upper layer portion of the element isolation insulating film 20, scattered by the element isolation insulating film 20, and introduced to the lower portion of the fin 10a. As a result, a punch-through stopper layer 21 is formed in the lower portion of the fin 10a.

Figure 6A:
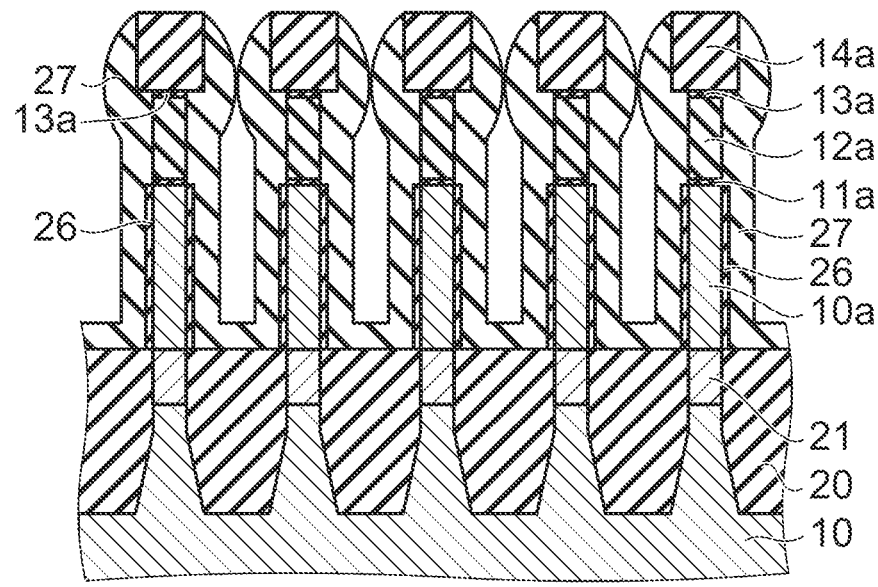

Then, as illustrated in FIG. 6A, the thermal oxidation treatment is performed to form a protective film 26 made of silicon oxide on the exposed surface of the fin 10a, namely, the side surface in the upper portion of the fin 10a. The protective film 26 may be formed by performing the plasma oxidation treatment or by depositing silicon oxide. For the plasma oxidation treatment, the surfaces of the silicon nitride members 12a and 14a are also oxidized.

Then, a sidewall protective film 27 is formed on the whole surface. A material for the sidewall protective film 27 differs from the materials for the silicon nitride member 12a, the silicon oxide member 13a, the silicon nitride member 14a, and the protective film 26. That is, the sidewall protective film 27 is made of a material except the silicon oxide and the silicon nitride, for example, non-doped amorphous silicon. The whole surface is etched back to remove a portion of the sidewall protective film 27, which is disposed on the silicon nitride member 14a, thereby exposing the silicon nitride member 14a. Therefore, the sidewall protective film 27 is left on the side surface of the stacked body including the upper portion of the fin 10a, the silicon oxide member 11a, the silicon nitride member 12a, the silicon oxide member 13a, and the silicon nitride member 14a and outside of the protective film 26.

Figure 6B:
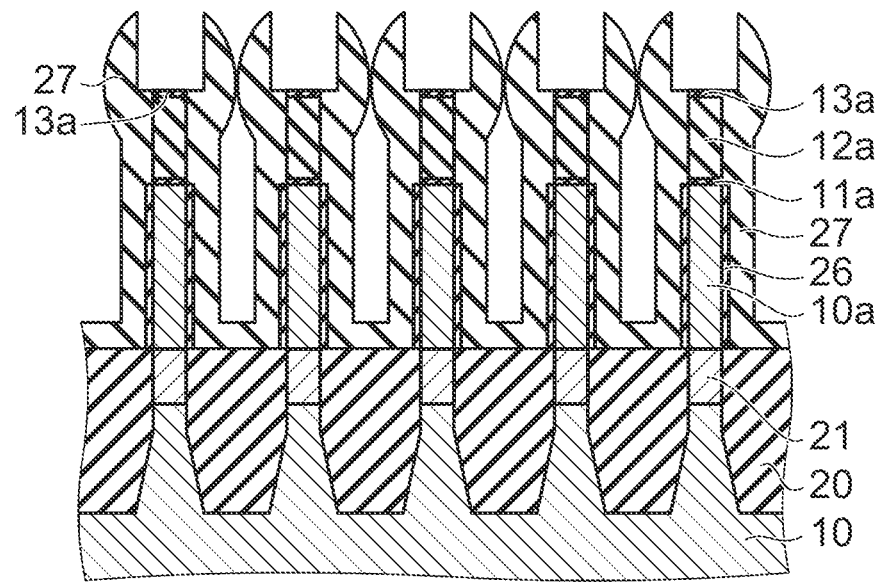

Then, as illustrated in FIG. 6B, for example, the silicon nitride member 14a is removed by the wet etching in which phosphoric acid ($H_3PO_4$) is used as an etching solution. At this point, the side surface of the silicon nitride member 12a is protected by the sidewall protective film 27, and the upper surface of the silicon nitride member 12a is protected by the silicon oxide member 13a. Therefore, the silicon nitride member 12a is not removed.

Figure 7A:
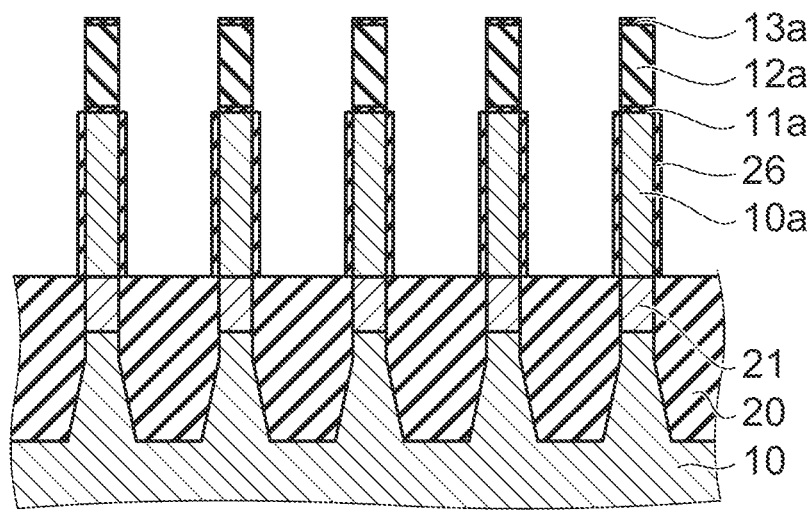

Then, as illustrated in FIG. 7A, the sidewall protective film 27 (see FIG. 6B) is removed by the wet etching in which, for example, an alkaline etching solution is used. At this point, the lower portion of the fin 10a is protected by the element isolation insulating film 20, and the side surface of the upper portion of the fin 10a is protected by the protective film 26, and the upper surface of the upper portion of the fin 10a is protected by the silicon oxide member 11a, the silicon nitride member 12a, and the silicon oxide member 13a. Therefore, the fin 10a is not etched.

Figure 7B:
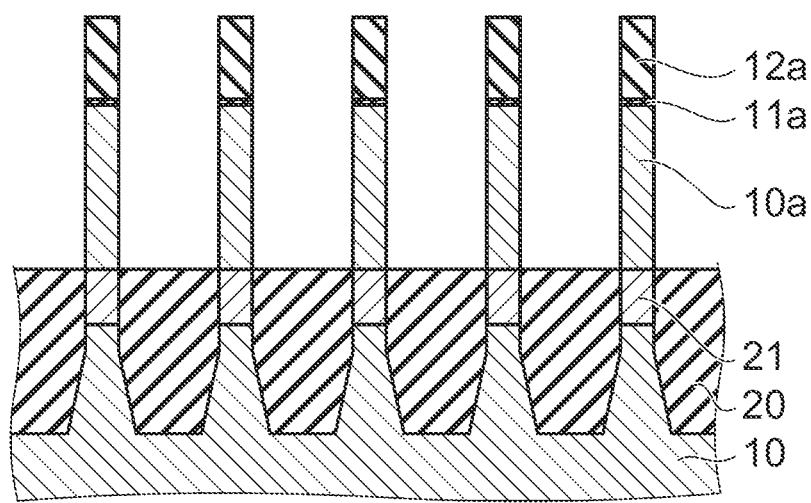

As illustrated in FIG. 7B, the silicon oxide member 13a and the protective film 26 are removed by the wet etching in which an etching solution containing hydrofluoric acid (HF) is used.

Figure 8A:
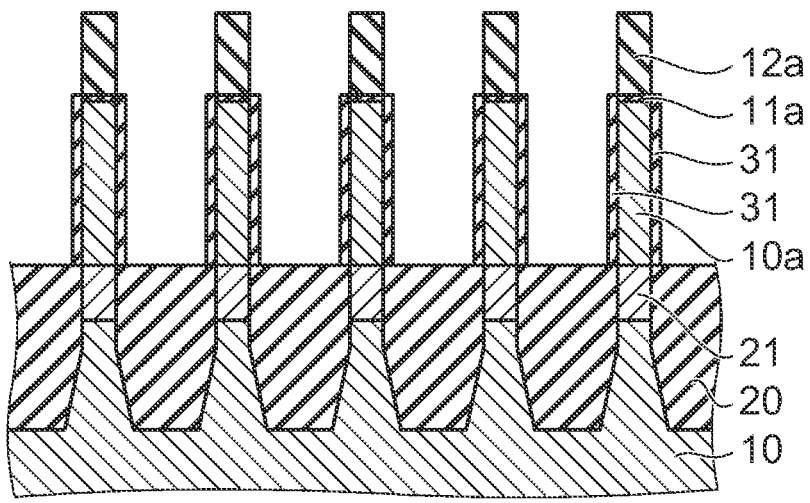
Figure 9:
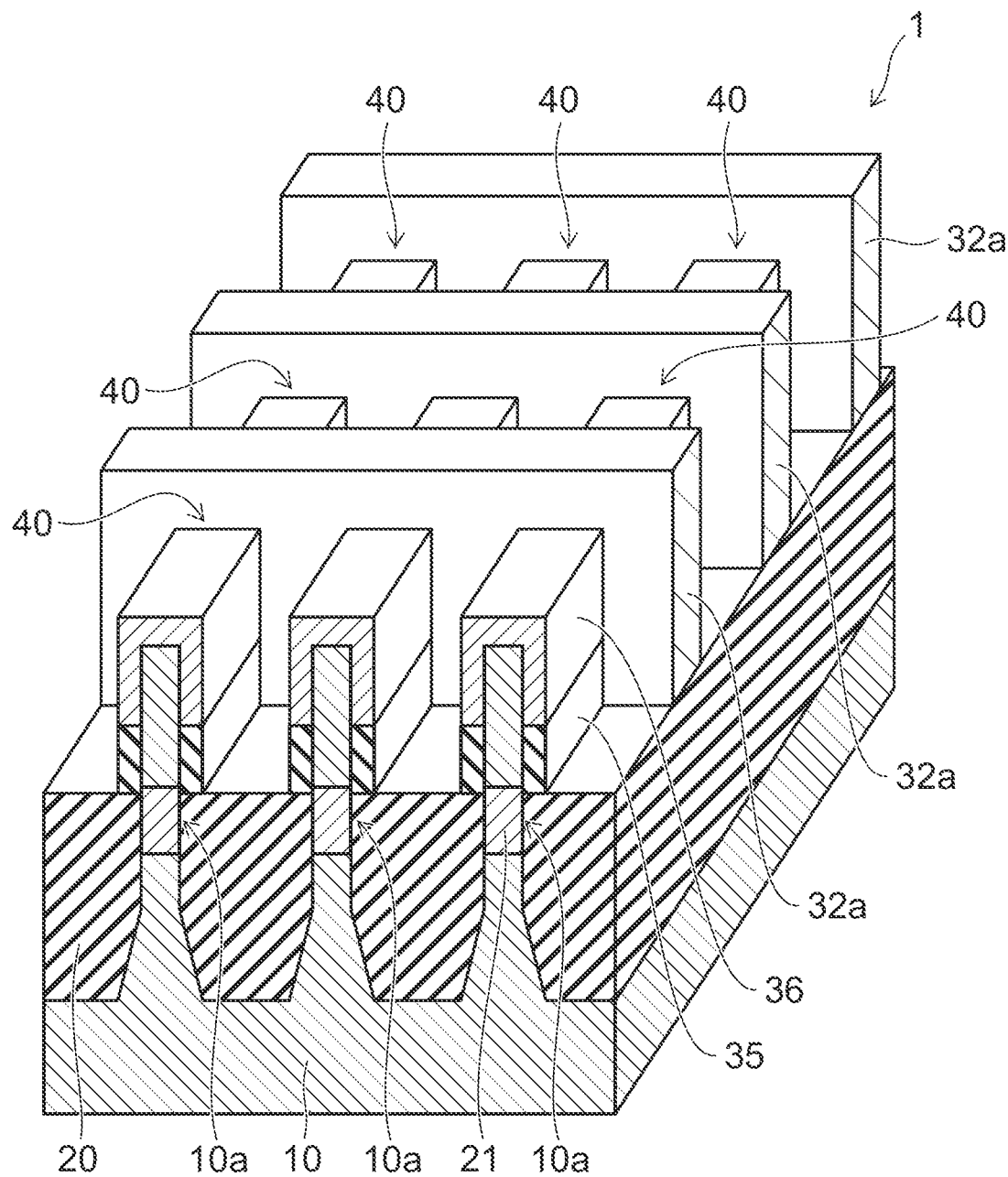
FIG. 9 is a perspective view illustrating a semiconductor device of the embodiment.

Then, as illustrated in FIG. 8A, for example, the thermal oxidation treatment is performed to form a gate insulator film 31 made of silicon oxide on the exposed surface of the fin 10a, namely, the side surface of the upper portion of the fin 10a.

Figure 8B:
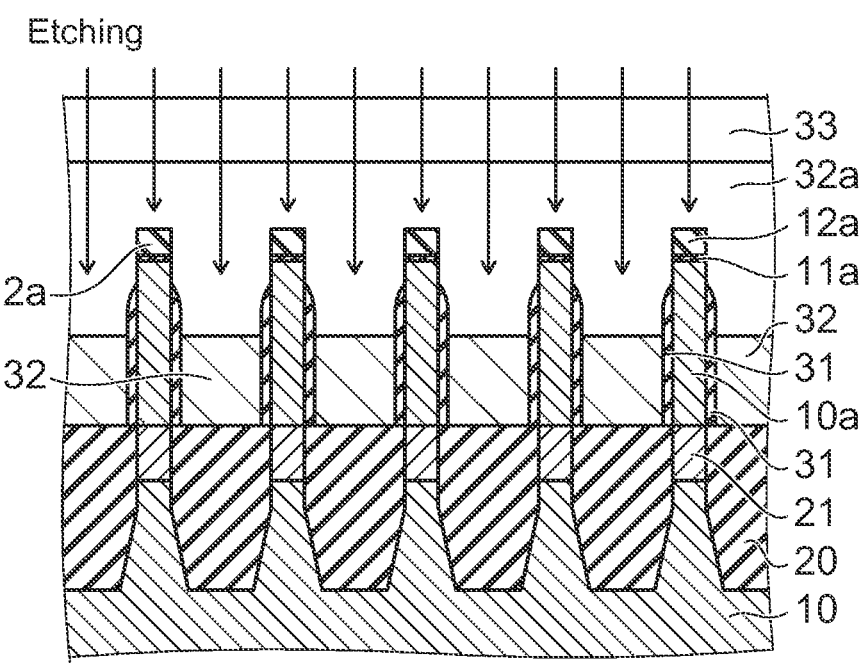

As illustrated in FIG. 8B, a conductive film 32 made of, for example, polysilicon into which the impurity is introduced is formed on the element isolation insulating film 20. The conductive film 32 covers the upper portion of the fin 10a, the silicon oxide member 11a, the silicon nitride member 12a, and the gate insulator film 31.

Then, a mask for gate 33 is formed on the conductive film 32 by, for example, a sidewall method. Plural patterns each of which extends in a direction intersecting the fin direction, for example, a direction orthogonal to the fin direction (hereinafter referred to as a "gate direction") are formed in the mask for gate 33.

Then, the conductive film 32 is selectively removed by performing the etching with the mask for gate 33 as a mask. Therefore, plural gate electrodes 32a each of which extends in the gate direction to straddle the fins 10a are formed. At this point, the fin 10a is not etched because the silicon nitride member 12a functions as a mask. Because the width of the silicon nitride member 12a is less than or equal to that of the fin 10a, the conductive film 32 is not left on the side surface of the fin 10a, namely, on the gate insulator film 31. At the time the processing of the gate electrode 32a is ended, the silicon nitride member 12a and the silicon oxide member 11a may disappear or remain. On the other hand, a large portion of the gate insulator film 31 remains.

Then, as illustrated in FIG. 9, an insulating film is deposited and etched back by anisotropic etching, such as the RIE, thereby forming an insulating sidewall 35 on the side surface of a portion, which is not covered with the element isolation insulating film 20 and the gate electrode 32a, in the lower portion of the fin 10a. Even if the silicon nitride member 12a remains in the process in FIG. 8B, the silicon nitride member 12a is removed in the anisotropic etching process. Then, the silicon oxide member 11a and the gate insulator film 31 are removed from the surface of the fin 10a, which is not covered with the gate electrode 32a. An epitaxial layer 36 is formed by epitaxial growth of silicon on the exposed surface of the fin 10a, namely, the surface of the fin 10a, which is not covered with the element isolation insulating film 20, the gate electrode 32a, and the sidewall 35. At this point, the epitaxial layer 36 is insulated from the gate electrode 32a.

As described above, a semiconductor device 1 of the embodiment is manufactured. In the semiconductor device 1, the plural fins 10a extending in the fin direction are formed in the upper layer portion of the silicon substrate 10, the plural gate electrodes 32a extending in the gate direction are formed so as to straddle the fins 10a, and the gate insulator film 31 (see FIG. 8A) is disposed between the fin 10a and the gate electrode 32a. The lower portion of the fin 10a is buried in the element isolation insulating film 20. In the upper portion of the fin 10a, the portion covered with the gate electrode 32a constitutes a channel region (not illustrated). In the upper portion of the fin 10a, the epitaxial layer 36 is formed on the surface of the portion that is not covered with the gate electrode 32a. In the upper portion of the fin 10a, the portion that is not covered with the gate electrode 32a, and the epitaxial layer 36 constitute a source-drain region. In the lower portion of the fin 10a, the punch-through stopper layer 21 is formed over the entire length in the fin direction. According to the configuration, a FinFET 40 is formed in each intersection of the fin 10a and the gate electrode 32a.

An advantageous effect of the embodiment will be described below. In the embodiment, as illustrated in FIG. 5A, the silicon nitride member 12a and the silicon nitride member 14a are provided on the fin 10a, and the silicon nitride member 14a is wider than the silicon nitride member 12a and the fin 10a. In the process in FIG. 6B, the silicon nitride member 14a is removed, and the silicon nitride member 12a is left. Therefore, the wide, thick mask member is made in the ion implantation process in FIG. 5B, namely, the process of performing the ion implantation of the impurity (for example, boron) to form the punch-through stopper layer 21, and the narrow, thin mask member is made in the etching process in FIG. 8B, namely, the process of etching the conductive film 32 to form the gate electrode 32a. As a result, the mask member having the shape necessary for each process can be prepared. The effect will be described in detail below.

First the width of the mask member will be described. In the ion implantation process in FIG. 5B, the wide silicon nitride member 14a is used as the mask, so that the implantation of the impurity in the side surface in the upper portion of the fin 10a can be suppressed. Therefore, the impurity is scattered in the upper layer portion of the element isolation insulating film 20, and the impurity can be introduced only to the lower portion of the fin 10a. As a result, the punch-through stopper layer 21 can be formed in a position that is designed, and a high, stable punch-through breakdown voltage can be implemented in the FinFET 40. A contamination of the impurity used to form the punch-through stopper layer 21 in the channel region of the FinFET 40 can be suppressed to stabilize a characteristic of the FinFET 40.

In the etching process in FIG. 8B, when the conductive film 32 is etched to form the gate electrode 32a, the silicon nitride member 12a in which the width is less than or equal to that of the fin 10a can be used as the mask that protects the fin 10a. As a result, the conductive film 32 can be prevented from being left on the side surface of the fin 10a after the etching, and a short circuit between the gate electrodes 32a can be prevented.

Then the thickness of the mask member will be described below. In the ion implantation process in FIG. 5B, the relatively thick mask member is made by stacking the silicon nitride members 12a and 14a. Therefore, the accelerated impurity does not pierce the mask member including the silicon nitride members 12a and 14a, but the impurity can be prevented from being implanted in the upper surface of the fin 10a. Accordingly, the contamination of the impurity used to form the punch-through stopper layer 21 in the channel region of the FinFET 40 can be prevented.

On the other hand, in the etching process in FIG. 8B, the relatively thin mask member is made using only the silicon nitride member 12a. Therefore, the thin mask member can be made to an extent that does not divide the conductive film 32 and that can protect the fin 10a together with the silicon oxide member 11a until the processing of the gate electrode 32a is ended. As a result, a damage of the fin 10a can be prevented while the gate electrode 32a extending in the gate direction is formed.

In the embodiment, in the process in FIG. 1A, the silicon nitride film 12 is set to the thickness to an extent in which the silicon nitride member 12a disappears before the epitaxial layer 36 is formed in the process in FIG. 9. Specifically, the silicon nitride member 12a is removed in the etching process of forming the gate electrode 32a or the etching process of forming the sidewall 35. Therefore, obstruction of the formation of the epitaxial layer 36 by the silicon nitride member 12a can be avoided even if the process of removing the silicon nitride member 12a is not provided after the processing of the gate electrode 32a.

Thus, in the embodiment, the silicon nitride members 12a and 14a of the two layers are provided, and the "wide", "thick" mask member necessary for the ion implantation process, the "narrow", "medium-thickness" mask member necessary for the etching process, and the mask-member non-existence state necessary for the process of forming the epitaxial layer can be implemented with proper timing in the following sequence of processes. As a result, the highly reliable semiconductor device 1 can be produced.

In the embodiment, the silicon nitride films 12 and 14 are stacked on the silicon substrate 10 in the process in FIG. 1A, and the silicon nitride member 14a, the silicon nitride member 12a, and the fin 10a are formed by forming the stripe pattern with the common mask material 15 in the process in FIG. 3A. The fin 10a is thinned in the process in FIG. 3B, and the silicon nitride member 12a is thinned in the process in FIG. 5A. Therefore, the silicon nitride member 14a can relatively be widened with respect to the silicon nitride member 12a and the fin 10a.

At this point, the silicon nitride film 12 and the silicon nitride film 14 are deposited by the different methods in the process in FIG. 1A, and the wet etching is performed under the condition that the etching rate of the silicon nitride member 12a is greater than that of the silicon nitride member 14a in the process in FIG. 5A. Therefore, the silicon nitride member 12a can selectively be etched so as to be narrower than the silicon nitride member 14a. The slimming of the silicon nitride member 12a is performed by utilizing the etchback of the element isolation insulating film 20. Therefore, it is not necessary to provide the dedicated process of slimming the silicon nitride member 12a, but the total number of processes can be decreased. In the process in FIG. 3B, the side portion of the fin 10a is oxidized to form the oxidation layer 10b, and then the fins 10a can be evenly narrowed by removing the oxidation layer 10b.

In the embodiment, in the process in FIG. 6B, the upper surface of the silicon nitride member 12a is covered with the silicon oxide member 13a, and the side surface of the silicon nitride member 12a is covered with the sidewall protective film 27 made of silicon. Then the silicon nitride member 14a is removed by performing the wet etching. Therefore, only the silicon nitride member 14a can be removed while the silicon nitride member 12a is protected.

In the process in FIG. 7A, the upper surface of the fin 10a is covered with the silicon oxide member 11a, and the side surface of the fin 10a is covered with the protective film 26. Then the sidewall protective film 27 is removed by performing the wet etching. Therefore, the sidewall protective film 27 can be removed while the fin 10a is protected.

The material and producing method for each member constituting the semiconductor device are not limited to the above embodiment. In the embodiment, the silicon nitride film 12 is formed by the LP-CVD method with hexachlorodisilane as the source gas, and the silicon nitride film 14 is formed by the LP-CVD method with dichlorosilane as the source gas. Alternatively, for example, the silicon nitride films 12 and 14 may be deposited using the identical source gas. For the use of the identical source gas, the etching rate can be changed by changing the deposition temperature. Generally, the etching rate is enhanced as the deposition temperature is lowered, and the selective removal is easy to perform.

In the embodiment, the semiconductor device 1 is the MRAM by way of example. The invention may be applied to any semiconductor device including the FinFET. Particularly, the invention is suitably applied to the FinFET in which the fin has a high aspect ratio. For example, the FinFET can suitably be applied to a memory device in which a large current is required while an integration degree of the memory cell is high.

Figure 10A:
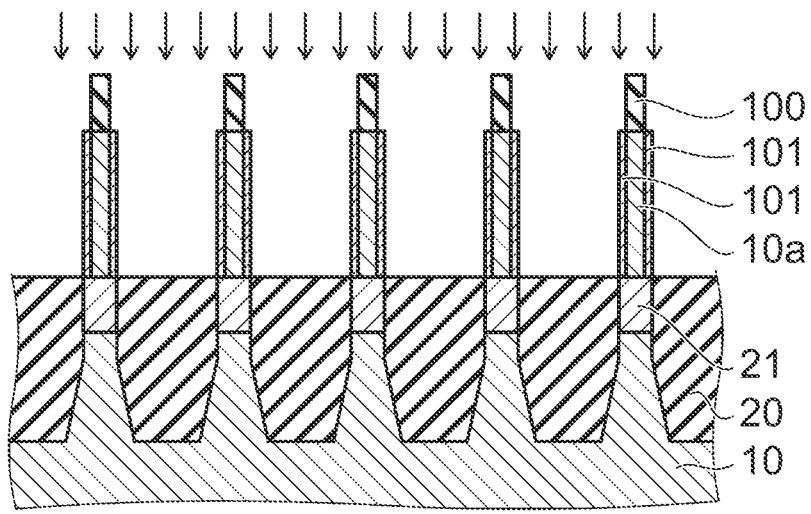
FIGS. 10A and 10B are process sectional views illustrating a method for manufacturing a semiconductor device according to a comparative example.
Figure 10B:
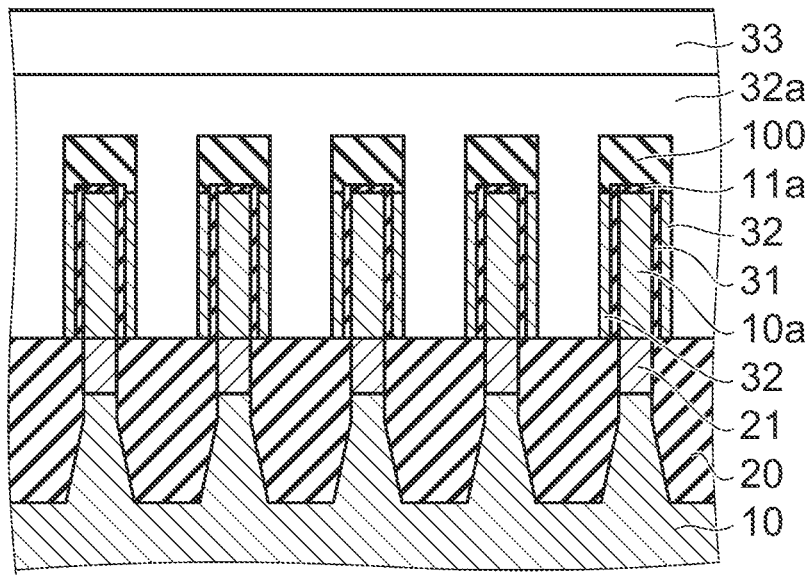

A comparative example will be described below. FIGS. 10A and 10B are process sectional views illustrating a semiconductor device producing method of the comparative example. FIG. 10A illustrates an ion implantation process corresponding to FIG. 5B of the embodiment, and FIG. 10B illustrates a state in which an etching process corresponding to FIG. 8B of the embodiment is ended.

In the comparative example, only a silicon nitride member 100 of one layer is formed as the mask member. As illustrated in FIG. 10A, when the width of the silicon nitride member 100 is less than or equal to that of the fin 10a, boron is directly implanted in the side surface in the upper portion of the fin 10a to form an impurity-implanted layer 101 in the process of performing the ion implantation of boron to form the punch-through stopper layer 21. Therefore, an impurity concentration in the channel region is deviated from a design value to degrade the characteristic of the FinFET.

On the other hand, as illustrated in FIG. 10B, when the silicon nitride member 100 is wider than the fin 10a, in etching the conductive film 32 to form the gate electrode 32a, the conductive film 32 is left in the region immediately below the silicon nitride member 100 between the gate electrodes 32a. Therefore, the short circuit is generated between the gate electrodes 32a.

In the comparative example, the characteristic of the semiconductor device is degraded. On the other hand, in the embodiment, the silicon nitride member used as the mask member has the two-layer structure, and the upper-side silicon nitride member 14a is wider than the lower-side silicon nitride member 12a and the fin 10a, so that the mask member having the proper width and thickness can be made in both the impurity implantation process and the gate electrode forming process.

According to the embodiment, the method for manufacturing the highly reliable semiconductor device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
   preparing a structure body, in which a fin extending in a first direction is formed on an upper surface of a semiconductor substrate, a lower-side mask member is provided in a region immediately above the fin via a silicon oxide member, and an upper-side mask member that is wider than the fin and the lower-side mask member is provided in a region including a region immediately above the lower-side mask member;

implanting an impurity into the semiconductor substrate with the upper-side mask member and the lower-side mask member as a mask;
removing the upper-side mask member;
forming a gate insulator film on a side surface of the fin;
forming a conductive film that covers the fin and the lower-side mask member;
forming a mask for gate, in which a pattern extending in a second direction intersecting the first direction is formed, on the conductive film; and
removing selectively the conductive film to form a gate electrode by performing etching with the mask for gate and the lower-side mask member as a mask, the gate electrode extending in the second direction to straddle the fin.

2. The method according to claim 1, wherein the preparing the structure body includes:
   forming a lower-side mask film on the semiconductor substrate;
   forming an upper-side mask film on the lower-side mask film;
   forming a mask for fin, in which a pattern extending in the first direction is formed, on the upper-side mask film;
   removing selectively the upper-side mask film, the lower-side mask film and an upper layer portion of the semiconductor substrate to form the upper-side mask member, the lower-side mask member, and the fin by performing etching with the mask for fin as a mask;
   slimming the fin; and
   slimming the lower-side mask member compared with the upper-side mask member by performing etching under a condition that an etching rate of the lower-side mask member is higher than an etching rate of the upper-side mask member.

3. The method according to claim 2, further comprising forming an element isolation insulating film that covers a lower portion of the fin,
   wherein the implanting the impurity includes scattering the impurity by the element isolation insulating film to introduce the impurity in the fin by implanting the impurity in the element isolation insulating film.

4. The method according to claim 3, wherein
   the forming the element isolation insulating film that covers the lower portion of the fin includes forming the element isolation insulating film so as to cover a stacked body including the fin, the lower-side mask member, and the upper-side mask member, and
   an upper surface of the element isolation insulating film is recessed to a level of a central portion in a vertical direction of the fin in the slimming the lower-side mask member compared with the upper-side mask member.

5. The method according to claim 2, wherein the slimming the fin includes:
   forming an oxidation layer by oxidizing a side portion of the fin; and
   removing the oxidation layer.

6. The method according to claim 2, wherein the lower-side mask film and the upper-side mask film are formed by different deposition methods and contain an identical component.

7. The method according to claim 2, wherein the preparing the structure body further includes forming a barrier film on the lower-side mask film, and the upper-side mask film is formed on the barrier film.

8. The method according to claim 7, wherein
the semiconductor substrate contains silicon,
the lower-side mask member and the upper-side mask member contain silicon nitride, and
the barrier film contains silicon oxide.

9. The method according to claim 7, further comprising:
forming a protective film on the side surface of the fin;
forming a sidewall protective film made of a material, which differs from materials for the lower-side mask member, the barrier film, the upper-side mask member, and the protective film, on a side surface of a stacked body including the fin, the lower-side mask member, the barrier film, and the upper-side mask member;
removing the sidewall protective film; and
removing the protective film,
wherein
the removing the upper-side mask member is performed between the forming the sidewall protective film and the removing the sidewall protective film, and
the forming the gate insulator film is performed after the removing the protective film.

10. The method according to claim 9, wherein
the sidewall protective film is formed of non-doped amorphous silicon in the forming the sidewall protective film, and
the sidewall protective film is removed by wet etching in which an alkaline etching solution is used in the removing the sidewall protective film.

11. The method according to claim 2, wherein
the lower-side mask film is formed by a chemical vapor deposition method in which hexachlorodisilane is used as a source gas, and
the upper-side mask film is formed by the chemical vapor deposition method in which dichlorosilane is used as the source gas.

12. The method according to claim 1, wherein the preparing the structure body includes:
   forming a lower-side mask film on the semiconductor substrate;
   forming an upper-side mask film on the lower-side mask film;
   forming a mask for fin, in which a pattern extending in the first direction is formed, on the upper-side mask film;
   removing selectively the upper-side mask film, the lower-side mask film, and an upper layer portion of the semiconductor substrate to form the upper-side mask member, the lower-side mask member, and the fin by performing etching with the mask for fin as a mask;
   forming an oxidation layer by oxidizing a side portion of the fin;
   forming an element isolation insulating film so as to cover a stacked body including the fin, the lower-side mask member, and the upper-side mask member; and
   recessing an upper surface of the element isolation insulating film to a level of a central portion in a vertical direction of the fin and slimming the lower-side mask member and the fin compared with the upper-side mask member, by performing etching under a condition that etching rates of the element isolation insulating film, the lower-side mask member, and the oxidation layer are higher than an etching rate of the upper-side mask member.

13. The method according to claim 12, wherein the lower-side mask film and the upper-side mask film are formed by different deposition methods and contain an identical component.

14. The method according to claim 12, wherein
the preparing the structure body further includes forming a barrier film on the lower-side mask film, and
the upper-side mask film is formed on the barrier film.

15. The method according to claim 14, wherein
the semiconductor substrate contains silicon,
the lower-side mask member and the upper-side mask member contain silicon nitride, and
the barrier film contains silicon oxide.

16. The method according to claim 14, further comprising:
forming a protective film on the side surface of the fin;
forming a sidewall protective film made of a material, which differs from materials for the lower-side mask member, the barrier film, the upper-side mask member, and the protective film, on a side surface of a stacked body including the fin, the lower-side mask member, the barrier film, and the upper-side mask member;
removing the sidewall protective film; and
removing the protective film,
wherein
the removing the upper-side mask member is performed between the forming the sidewall protective film and the removing the sidewall protective film, and
the forming the gate insulator film is performed after the removing the protective film.

17. The method according to claim 16, wherein
the sidewall protective film is formed of non-doped amorphous silicon in the forming the sidewall protective film, and
the sidewall protective film is removed by wet etching in which an alkaline etching solution is used in the removing the sidewall protective film.

18. The method according to claim 12, wherein
the lower-side mask film is formed by a chemical vapor deposition method in which hexachlorodisilane is used as a source gas, and
the upper-side mask film is formed by the chemical vapor deposition method in which dichlorosilane is used as the source gas.

19. The method according to claim 1, further comprising forming a semiconductor layer on a surface in a portion of the fin, which is not covered with the gate electrode,
wherein the lower-side mask member is set to a thickness in which the lower-side mask member disappears before forming the semiconductor layer.

20. The method according to claim 1, wherein
a plurality of fins are formed in preparing the structure body, and
a plurality of gate electrodes are formed in forming the gate electrode.

* * * * *